US006113703A

United States Patent [19]
Anderson et al.

[11] Patent Number: 6,113,703
[45] Date of Patent: Sep. 5, 2000

[54] METHOD AND APPARATUS FOR PROCESSING THE UPPER AND LOWER FACES OF A WAFER

[75] Inventors: Roger N. Anderson, San Jose, Calif.; Seiji Arima, Katore gun, Japan; Mahalingam Venkatesan, San Jose, Calif.; Kunio Kurihara, Chiha Pref., Japan

[73] Assignee: Applied Materials, Inc., Santa Clara, Calif.

[21] Appl. No.: 09/200,176

[22] Filed: Nov. 25, 1998

[51] Int. Cl.⁷ ..................................... C23C 16/00
[52] U.S. Cl. ............................. 118/725; 118/724
[58] Field of Search ..................... 118/725, 724, 118/720, 723 IR, 728, 715; 156/345

[56] References Cited

U.S. PATENT DOCUMENTS 5,790,750  8/1998  Anderson ................................ 118/725
5,960,159  9/1999  Ikeda et al. ............................. 118/724

*Primary Examiner*—Shrive Beck
*Assistant Examiner*—P. Hassanzadeh
*Attorney, Agent, or Firm*—Blakely Sokoloff Taylor & Zafman

[57] ABSTRACT

A method and apparatus for processing opposing surfaces of a wafer. In one embodiment a semiconductor processing chamber is provided having an opening which allows for insertion of a wafer. A wafer holder is located within the semiconductor processing chamber for receiving the wafer. An inlet port allows flow of gas into the semiconductor processing chamber. An outlet port allows flow of gas from the semiconductor processing chamber. A first heat plate is mounted within the semiconductor processing chamber so that a first face of a wafer, when held by the wafer holder, faces towards the first heat plate. A first heat source is located to heat the first heat plate. A second heat plate is mounted in position within the semiconductor processing chamber so that a second face of the wafer, opposing the first face, faces towards the second heat plate. A second heat source is located to heat the second heat plate.

19 Claims, 5 Drawing Sheets

METHOD AND APPARATUS FOR PROCESSING THE UPPER AND LOWER FACES OF A WAFER

BACKGROUND OF THE INVENTION

1). Field of the Invention

This invention relates generally to a semiconductor processing system and, more specifically, to the semiconductor processing system which allows for processing on opposing faces of a wafer.

2). Discussion of Related Art

The manufacture of integrated circuits involves subjecting a semiconductor wafer to respective processing steps. Any one of a number of processing steps may be carried out including deposition of a layer of material onto the wafer, etching a layer of material which is formed on the wafer, or causing chemical reactions with material formed on the wafer.

Each of these processing steps is carried out in a respective semiconductor processing chamber. One or more of these processing steps may be carried out in a chemical vapor deposition processing chamber such as the processing chamber 1 shown in FIG. 1A. A wafer 2 is inserted through an opening (not shown) into the processing chamber 1 and located on a susceptor 3. Upper heat lamps 4 are generally used to radiate infrared light through an upper window 5 of the processing chamber 1 onto the wafer 2. Lower heat lamps 6 may also be used to radiate infrared light through a lower window 7 of the processing chamber 1 onto the susceptor 3. By controlling power supplied to the heat lamps 4 and 6 the wafer 2 can be maintained at a required processing temperature.

One or more gasses are then introduced into the processing chamber 1. These gasses then carry out one of the processing steps, as previously discussed with the wafer 2 being maintained at a required processing temperature.

In some instances, it may be desirable to process a wafer on opposing faces thereof. FIG. 1B illustrates the apparatus shown in FIG. 1A which is modified for purposes of processing on opposing faces of a wafer. The wafer 2 is elevated from the susceptor 3 by means of a lifting assembly 8a having one or more seats 8b which make contact with a lower face of the wafer 2. With the wafer elevated above the susceptor, processing gasses are permitted to flow through a passage 9 between the wafer 2 and the susceptor 3. By spacing the wafer 1 a distance from the susceptor 3 it becomes more difficult to control the temperature of the wafer 2 via the susceptor 3. In addition, the process gasses tend to flow faster over the upper face of the wafer than through the passage 9 defined between the lower face of the wafer 2 and the susceptor 3, with resulting differences, or lack of control, of processing rates on the upper and lower faces of the wafer.

SUMMARY OF THE INVENTION

The invention relates to a semiconductor processing system. A semiconductor processing chamber is provided having an opening which allows for insertion of a wafer. A wafer holder is located within the semiconductor processing chamber for receiving the wafer. An inlet port allows flow of gas into the semiconductor processing chamber. An outlet port allows flow of gas from the semiconductor processing chamber. A first heat plate is mounted within the semiconductor processing chamber so that a first face of a wafer, when held by the wafer holder, faces towards the heat plate. A first heat source is located to heat the first heat plate. A second heat plate is mounted in position within the semiconductor processing chamber so that a second face of the wafer, opposing the first face, faces towards the second heat plate. A second heat source is located to heat the second heat plate.

Each heat plate has a heating surface facing towards a respective face of the wafer. Each heating surface may be equidistantly spaced from the respective face of the wafer. One fluid flow passage is defined between the first heat plate and the first face, and another fluid flow passage is defined between the second heat plate and the second face.

In use the first heat source heats the first heat plate which, in turn, heats the first face, and the second heat source heats the second heat plate which, in turn, heats the second face. Gas is introduced through the inlet port and flows through the two gas flow passages over the opposing faces of the wafer.

Heating of the wafer can be accurately controlled by the positioning of the heat plates, while substantially equal gas flow may be maintained over the opposing faces of the wafer.

A temperature detector may be located to measure a temperature on the first heat plate and another temperature detector may be located to measure a temperature on the second heat plate. While measuring the temperatures of the heat plates an indirect indication can be obtained of the temperature of the wafer.

BRIEF DESCRIPTION OF THE DRAWINGS

The invention is further described by way of example with reference to the accompanying drawings wherein.

DESCRIPTION OF PREFERRED EMBODIMENT

A semiconductor processing system and a method of processing a semiconductor wafer are described. In the following description, numerous specific details are set forth, in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

A wafer is located within a semiconductor processing chamber. Upper and lower heat plates are located on opposing sides or faces of the wafer. Heat lamps above the semiconductor processing chamber heat the upper heat plate and heat lamps below the semiconductor processing chamber heat the lower heat plate. The heat plates, in turn, transfer heat to the wafer. By indirectly heating the wafer via the heat plates, opposing faces of the wafer can be heated substantially at the same rate. Moreover upper and lower gas flow passages are defined respectively between the wafer and the upper heat plate, and the wafer and the lower heat plate. The upper and lower gas flow passages are substantially of equal width so that substantially equal flow rates of processing gasses are maintained over the opposing faces of the wafer.

Figure 1A:
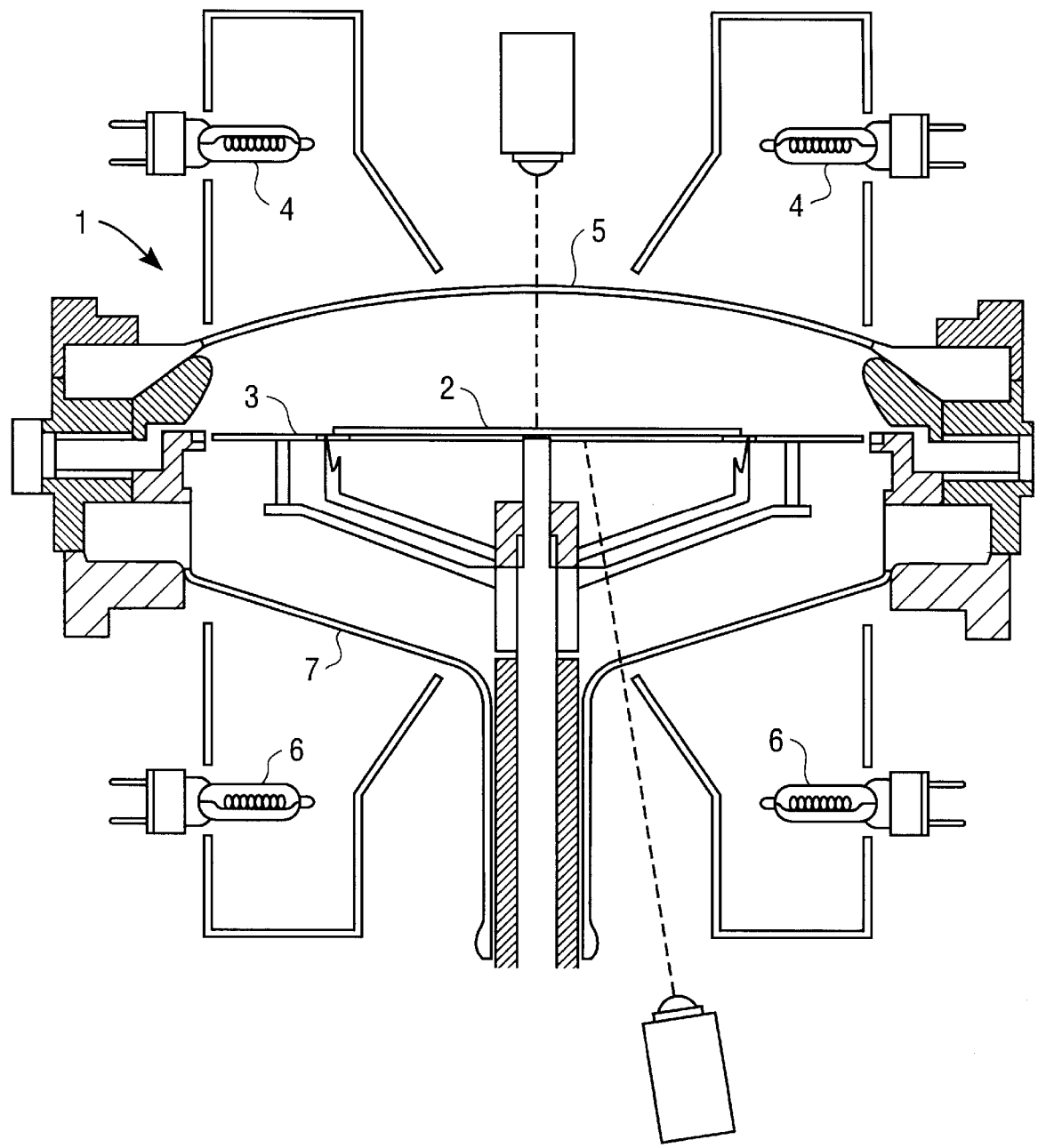
FIG. 1A is a partially sectioned side view of a prior art semiconductor processing system.
Figure 1B:
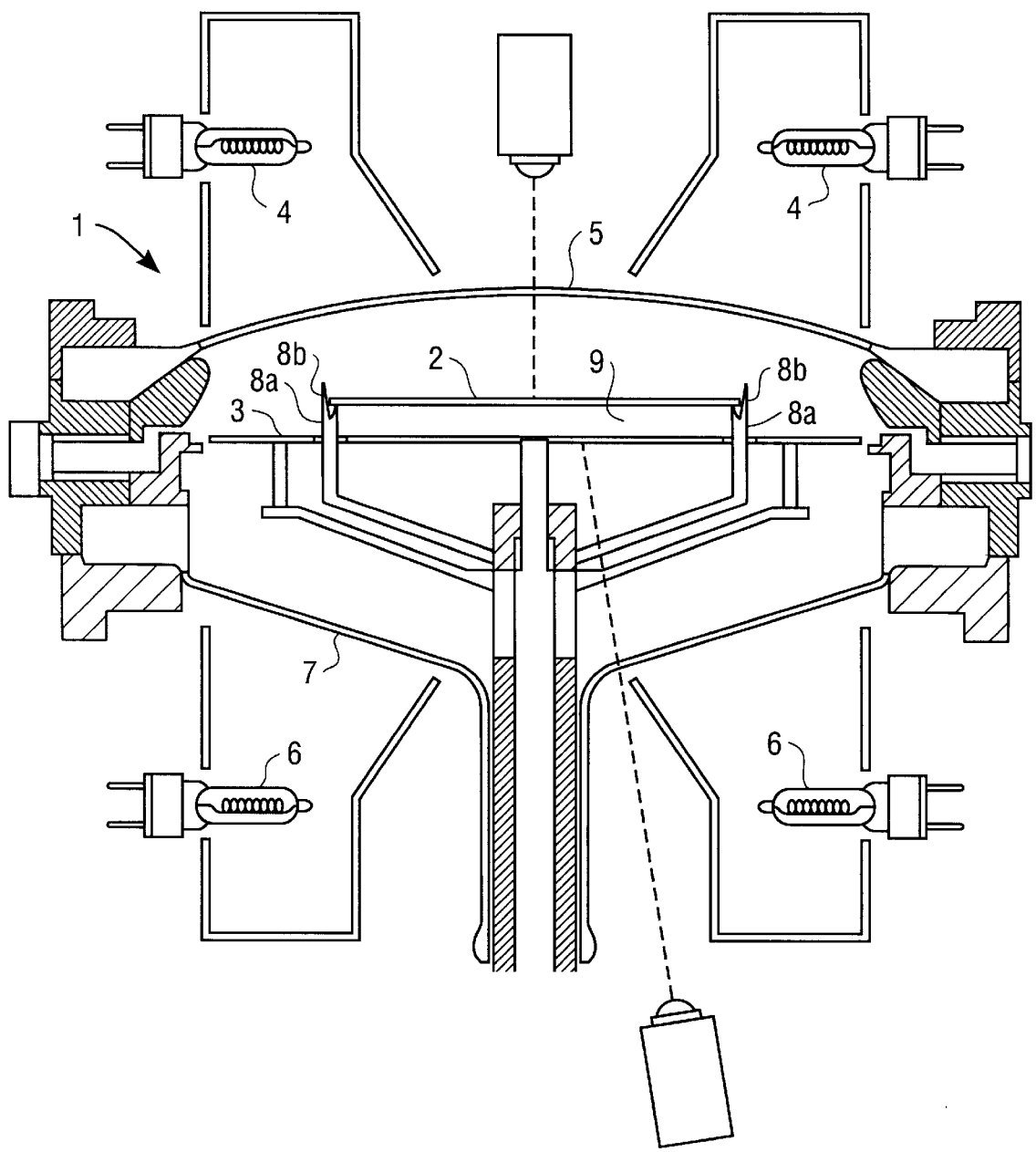
FIG. 1B shows the semiconductor processing system of FIG. 1A with a wafer being supported above the susceptor.
Figure 2:
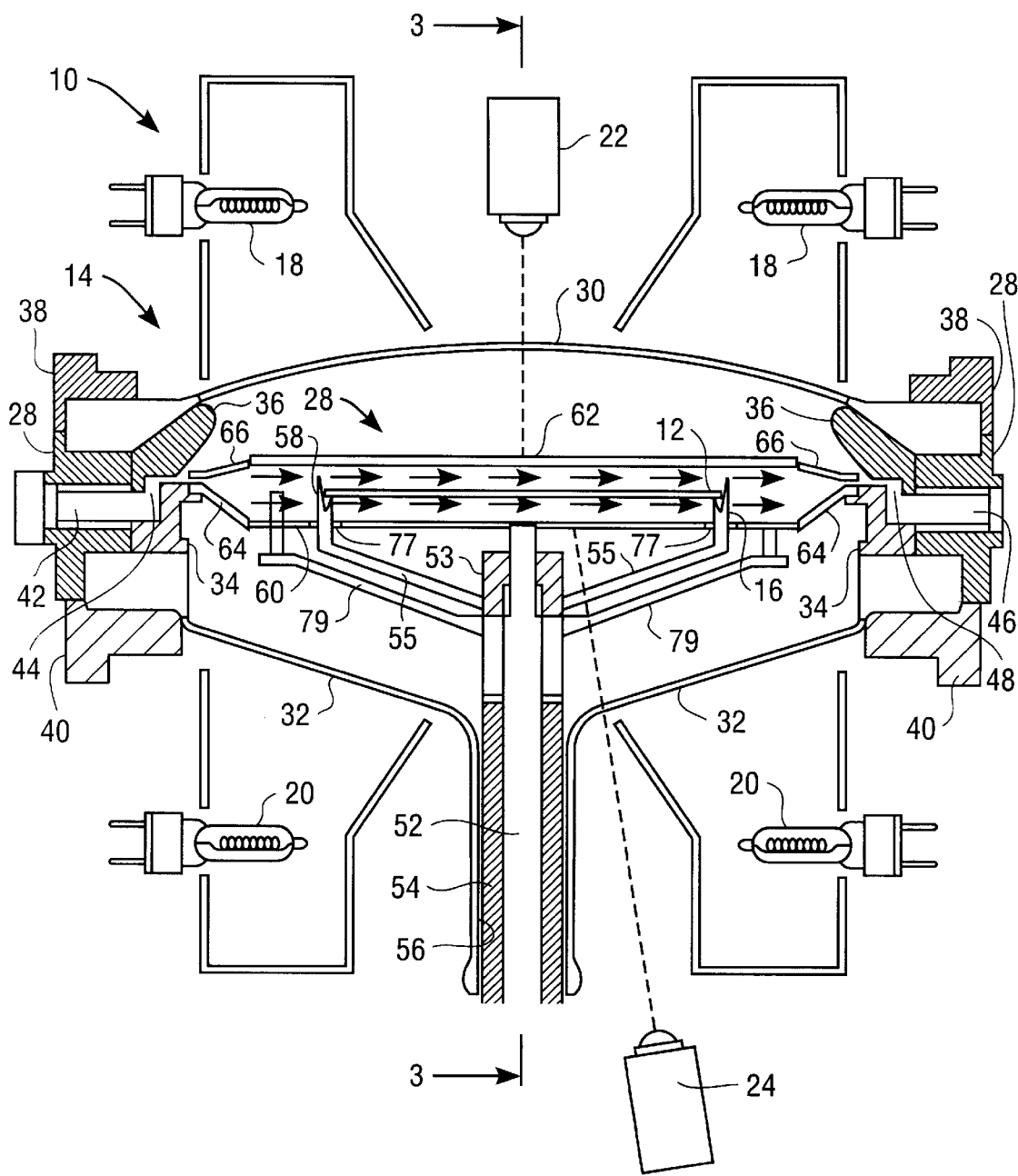
FIG. 2 is a partially sectioned side view of a semiconductor processing system according to an embodiment of the invention.

FIG. 2 of the accompanying drawings illustrates a semiconductor processing system 10, according to an embodiment of the invention, which is used for processing a wafer 12 according to chemical vapor deposition principles.

The semiconductor processing system 10 includes a semiconductor processing chamber 14, a wafer holder 16 located within the semiconductor processing chamber 14, an array of infrared heat lamps 18 located above an array of infrared heat lamps 20 located below the semiconductor processing chamber 14, a pyrometer 22 located above and a pyrometer 24 located below the semiconductor processing chamber 14, and a temperature and processing control assembly 26 located within the semiconductor processing chamber 14. The temperature and processing control assembly 26 is utilized for controlling heating of the wafer 12 and controlling flow of processing gasses over the wafer 12 as will be further described hereinbelow.

The semiconductor processing chamber 14 includes a stainless steel base ring 28, an upper quartz window 30, a lower quartz window 32, a lower liner 34, an upper liner 36, an upper ring flange 38, and a lower ring flange 40.

The upper quartz window 30 seals circumferentially with an upper edge of the base ring 28. The lower quartz window 32 seals circumferentially with an lower edge of the base ring 28. The quartz windows 30 and 32 are secured to the base ring 28 by locating the upper and lower ring flanges, 38 and 40 respectively, over the windows 30 and 32 and securing the ring flanges 38 and 40 to the base ring 28.

The upper liner 36 covers a portion of the base ring 28 and a portion of the upper quartz window 30. The lower liner 34 rests on an outer edge of the lower quartz window 32 and covers a portion of the lower quartz window 32 and a portion of the base ring 28.

An inlet port 42 is formed through the base ring 28. An inlet channel 44 between the lower and upper liners 34 and 36 connects the inlet port 42 with the inner dimensions of the semiconductor processing chamber 14.

An outlet port 46 is formed through the base ring 28 on a side of the base ring 28 opposing the inlet port 42. An outlet channel 48 between the lower and upper liners 34 and 36 connects the inner dimensions of the semiconductor processing chamber 14 with the outlet port 46.

Figure 3:
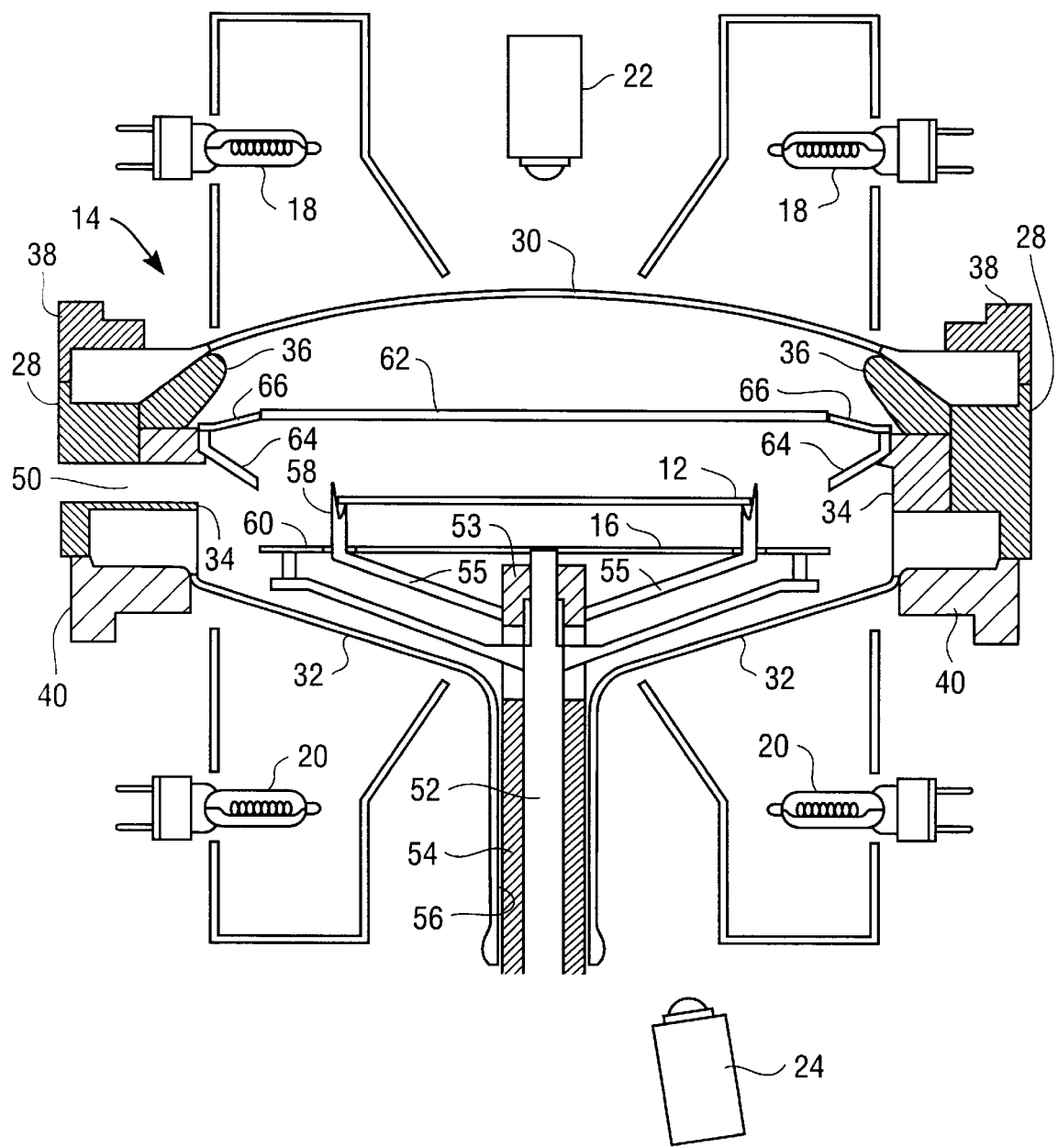
FIG. 3 is a sectioned side view along line 3—3 of the semiconductor processing system of FIG. 2.

FIG. 3 is a sectioned side view of the semiconductor processing system 10 along line 3—3 in FIG. 2. As shown in FIG. 3, a slot 50 is formed through the base ring 28 and the lower liner 34. The slot 50 is dimensioned to allow for a wafer carrying blade (not shown) to be inserted into the semiconductor processing chamber 14. A ceiling door (not shown) isolates the chamber.

Referring again to FIG. 2, a support shaft 52 and a surrounding actuating cylinder 54 extend through an opening 56 in the lower window 32. The wafer holder 16 includes a number of arms 55 extending from a sleeve 53 positioned on the support shaft 52. The wafer holder arms 55 terminate in discrete wafer seats 58 which support the wafer 12 in a horizontal position. Vertical movement of the actuating cylinder 54 moves the sleeve 53 vertically on the support shaft 52, causing the wafer 12 to be moved upward or downward on seats 58.

Figure 4:
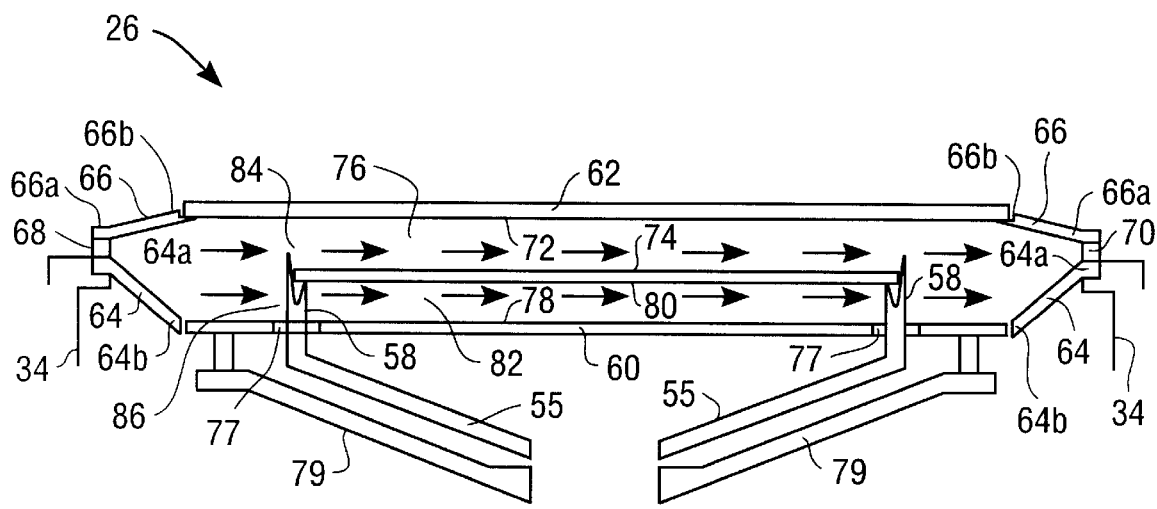
FIG. 4 is a sectioned side view of temperature and processing control assembly forming part of the semiconductor processing system of FIG. 2.

FIG. 4 is an enlarged view of the temperature and processing control assembly 26 and the wafer 12. The temperature and processing control assembly 26 includes a lower heat plate 60, an upper heat plate 62, a lower conical ring 64, and an upper conical ring 66.

The lower conical ring 64 has an outer edge 64a which rests on the lower liner 34, and an inner edge 64b which is lower than the outer edge 64a thereof. The upper conical ring 66 has an outer edge 66a which rests on the outer edge 64a of the lower conical ring 64 and an inner edge 66b which is higher than the outer edge 66a thereof. An inlet gap 68 is defined between the outer edges 64a and 66a of lower and upper conical rings 64 and 66. An outlet gap 70 is formed between the outer edges 64a and 66a of the lower and upper conical rings, 64 and 66, on a side opposing the inlet gap 68.

The upper heat plate 62 has an outer edge which rests on the inner edge 66b of the upper conical ring 66.

The upper heat plate 62 is larger than the wafer 12 and has a lower heating surface 72 which faces an upper face 74 of the wafer 12. The lower heating surface 72 of the upper heat plate 62 is substantially equidistantly spaced from the upper face 74 along the length of the wafer 12. An upper gas flow passage 76 is thereby defined between the lower heating surface 72 of the upper heat plate 62 and the upper face 74 of the wafer 12.

Openings 77 are formed through the lower heat plate 60 and the arms 55 extend through the openings 77. Arms 79 are also provided which mount the lower heat plate 60 to the support shaft 52. Vertical movement of the support shaft 52 causes vertical movement of the lower heat plate 60.

The lower heat plate 60 is substantially the same size of the upper heat plate 62 and has an upper heating surface 78 which faces a lower face 80 of the wafer 12. A lower gas flow channel 82 is thereby defined between the upper heating surface 78 of the lower heat plate 60 and the lower face 80 of the wafer 12.

The heat plates 60 and 62 are typically made of a material that is opaque to infrared light. In one embodiment, the heat plates 60 and 62 are made of silicon carbide coated graphite for low contamination reasons and its resistance to chemical gasses such as hydrogen chloride which is used for cleaning the semiconductor processing chamber 14.

Referring again to FIGS. 2 and 3, the heat lamps 18 are positioned to radiate infrared light through the upper window 30 and onto the upper heat plate 62. The heat lamps 20 are positioned to radiate infrared light through the lower window 32 onto the lower heat plate 60.

Pyrometers 24 and 22 measure the temperature of plates 60 and 62, respectively, and generate signals in response to their measured temperatures. The signals generated are used as inputs to a controller (not shown) which controls the power supplied to the respective heats lamps 20 and 18, respectively.

Before the wafer 12 is inserted into the semiconductor processing chamber 14, both the lower heat plate 62 and the wafer seats 58 are lowered to below the wafer insertion slot 50, as shown in FIG. 3. A blade carrying the wafer 12 is then inserted into the semiconductor processing chamber 14 through the slot 50. The wafer seats 58 are then elevated by means of the actuating cylinder 54 to lift the wafer 12 off the blade. The blade is then removed from the semiconductor processing chamber 14. The lower heat plate 60 is then elevated by means of the support post 52 until an outer edge of the lower heat plate 60 is adjacent the inner edge 64a of the lower conical ring 64, as shown in FIG. 2. The wafer 12 and the lower heat plate 60 are typically moved so that a distance between the wafer 12 and the upper heat plate 62 is substantially equal to a distance between the wafer 12 and the lower heat plate 60. The distance between the wafer 12 and the lower heat plate 60 may, alternatively, be selected differently from the distance between the wafer 12 and the upper heat plate 62 so as to control or create different rates of processing on the upper and lower faces, 74 and 80 respectively, of the wafer 12.

In one embodiment, the spacing between the wafer 12 and the lower heat plate 60 may be in the range of between 1 to 30 millimeters, and is typically in the range of about 8–12 millimeters. The invention may also find application in other embodiments wherein a wafer is spaced from a heat plate more than 30 millimeters.

Both the upper heat plate 62 and the lower heat plate 60 are wider than a diameter of the wafer 12.

The upper heat plate 62 is heated by means of the heat lamps 18. Heating of the upper heat plate 62 is primarily by means of infrared radiation. Once the upper heat plate 62 has reached an elevated temperature, the lower heating surface 72 of the upper heat plate 62 heats the upper face 74 of the wafer 12. Heating of the wafer 12 is achieved by means of convection heat transfer through the upper gas flow passage 76, and by means of the radiation heat transfer from the lower heating surface 72 of the upper heat plate 62.

Similarly, the heat lamps 20 heat the lower heat plate 60. The lower heat plate 60, in turn, heats the lower face 80 of the wafer by means of convection heat transfer through the lower gas flow passage 82, and radiation heat transfer from the upper heating surface 78 of the lower heat plate 60.

While the wafer 12 is being heated, a processing gas may be injected into the semiconductor processing chamber 14. The processing gas is introduced into the inlet port 42 from where it flows through the inlet channel 44 and then through the inlet gap 68 of assembly 26. An outer edge of the lower heat plate 60 is adjacent to the inner edge 64b of the lower conical ring 64 and, as mentioned previously, an outer edge of the upper heat plate 62 rests on an inner edge 66b of the upper conical ring 66. The conical rings 64 and 66 direct the gas from the inlet gap 68 to inlet openings 84 and 86 of the upper and lower gas flow passages 76 and 82 respectively. Although in FIG. 4 a wafer seat 58 is shown where the inlet opening 86 is, it should be understood that the wafer seat only fills a portion of the inlet opening 86. The gas then flows through the gas flow passages 76 and 82. The gas reacts with, or forms a layer on the wafer 12 while flowing over the faces 74 and 80 of the wafer 12. Since the upper and lower gas flow passages 76 and 82 have similar dimensions, the gas flows at substantially the same rate through each gas flow passage. As mentioned previously, the dimensions of the flow passages 76 and 82 may be varied to control or create different rates of processing on the upper and lower faces, 74 and 80 respectively, of the wafer 12.

The gas is then channeled by means of the conical rings 64 and 66 to the outlet gap 70 from where the gas flows through the outlet channel 48 and exhausts through the outlet port 46 of chamber 14.

The conical rings 64 and 66 together with the heat plates 60 and 67 therefore provide an enclosure around the wafer 12 which contains and channels processing gas from the inlet port 42 over the wafer to the outlet port 46.

The conical rings 64 and 66 together with the heat plates 60 and 62 also provide a near isothermal enclosure around the wafer 12. The isothermal enclosure minimizes heat losses at an edge of the wafer 12. The wafer is then maintained at a more uniform temperature over its width. By maintaining the wafer 12 at a more uniform temperature over its width, more uniform processing of the wafer is achieved.

While the wafer 12 is being processed, the pyrometers 22 and 24 detect the temperatures of the heat plates 60 and 62. The temperatures of the heat plates are indicative of the temperature of the wafer 12. By indirectly obtaining the temperature of the wafer 12, a controller, may be used to control the power supplied to the respective heat lamps 18 and 20 so that the heat plates 60 and 62 (and the wafer 12) are maintained at a temperature required for purposes of processing the wafer 12. The heat lamps 18 or 20 may also be controlled so as to provide radial control over the heat plates 60 and 62. In particular, the heat plates 60 and 62 may be maintained at substantially the same temperature so that the faces 74 and 80 of the wafer are processed at substantially the same temperature.

It can be seen from the foregoing description that the wafer 12 is indirectly heated via the heat plates 60 and 62. By sizing and positioning the heat plates as required, the temperature of the wafer 12 can be controlled with regulative accuracy. In particular, the upper heat plate 62 together with the heat lamps 18 provide a heating system for the upper surface 74 of the wafer 12 which may be substantially the same as a heating system for the lower surface 80 provided by the lower heat plate 60 and the heat lamps 20. Moreover, gas flow over opposing faces of the wafer may be substantially the same. The upper and lower surfaces, 74 and 80 respectively, can therefore be processed at a similar rate in a similar manner. Alternatively, heat plates 60 and 62 may be sized and positioned so as to vary the processing rate on opposing surfaces of wafer in accordance with a desired processing recipe.

Thus, a semiconductor processing system and a method of processing a semiconductor wafer have been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed:

1. A semiconductor processing system comprising:

a processing chamber;

a wafer holder located within the processing chamber;

a first heat plate located within the processing chamber so that a first face of a wafer, when held by the wafer holder, faces the first heat plate;

a second heat plate located within the processing chamber so that a second face of the wafer, opposing the first face, faces the second heat plate; and a first conical ring located adjacent the first heat plate and a second conical ring located adjacent the second heat plate, the first and second heat plates and first and second conical rings substantially forming an enclosure around a wafer when located on the wafer holder.

2. The semiconductor processing system of claim 1 which includes:

a first heat source located to heat the first heat plate; and a second heat source located to heat the second heat plate.

3. The semiconductor processing system of claim 1 wherein the first and second heat plates form at least part of an enclosure around the wafer.

4. The semiconductor processing system of claim 1 wherein the first and second heat plates are opaque to infrared radiation.

5. The semiconductor processing system of claim 1 wherein the first heat plate has a first heating surface, and wherein a first gas flow passage is defined between the first heating surface and the first face.

6. The semiconductor processing system of claim 5 wherein the first gas flow passage is defined over the entire diameter of the wafer.

7. The semiconductor processing system of claim 5 wherein the processing chamber includes a gas inlet port and a gas outlet port, the first gas flow passage having an inlet opening which is positioned to receive gas when injected into the gas inlet port of the processing chamber.

8. The semiconductor processing system of claim 1 (a) wherein the first heat plate has a first heating surface, and wherein a first gas flow passage is defined between the first heating surface and the first face, and (b) the second heat plate has a second heating surface, and wherein a second gas flow passage is defined between the second heating surface and the second face.

9. The semiconductor processing system of claim 8 wherein the first and second gas flow passages are defined over the entire diameter of the wafer.

10. The semiconductor processing system of claim 1 wherein the enclosure is substantially isothermal.

11. The semiconductor processing system of claim 1 further comprising at least one temperature detector which detects a temperature on at least one of the first and second heat plates.

12. The semiconductor processing system of claim 1 which includes a first temperature detector which detects a temperature on the first heat plate, and a second temperature detector which detects a temperature on the second heat plate.

13. A semiconductor processing system which includes:
a processing chamber;
a wafer holder located within the processing chamber;
an inlet port allowing flow of gas into the processing chamber;
an outlet port allowing flow of gas from the processing chamber;
a first heat plate located within the processing chamber so that a first surface of the first heat plate is spaced from an inner surface of the chamber and a first face of a wafer, when held by the wafer holder, faces towards and is spaced from a second, opposing surface of the first heat plate;
a first heat source located to heat the first heat plate;
a second heat plate located within the processing chamber so that a first surface of the second heat plate is spaced from an inner surface of the chamber and a second face of the wafer, opposing the first face, faces towards the second heat plate; and
a second heat source located to heat the second heat plate.

14. The semiconductor processing system of claim 13 wherein the first and second heat plates form at least part of an enclosure around the wafer.

15. The semiconductor processing system of claim 14 wherein the enclosure is substantially isothermal.

16. The semiconductor processing system of claim 13 further comprising at least one temperature detector that detects a temperature on at least one of the first and second heat plates.

17. The semiconductor processing system of claim 13 further comprising first and second temperature detectors, the first temperature detector detects a temperature on the first heat plate and the second temperature detector detects a temperature on the second heat plate.

18. A semiconductor processing system which includes:
a processing chamber which includes a base ring, an upper window which seals circumferentially with an upper edge of the base ring, a lower window which seals circumferentially with a lower edge of the base ring, the base ring defining an opening for inserting a wafer into the processing chamber, an inlet port allowing flow of gas into the processing chamber and an outlet port allowing flow of gas out of the processing chamber;
a wafer holder located within the processing chamber;
an upper heat plate located within the processing chamber, the upper heat plate having a first heating surface which is spaced from an upper face of a wafer when held by the wafer holder and defining an upper gas flow passage between the first heating surface and the upper face of the wafer, the upper gas flow passage having an inlet opening which is positioned to receive gas when injected into the processing chamber through the inlet port;
a lower heat plate located within the processing chamber, the lower heat plate having a second heating surface which is spaced a distance from a lower face of the wafer and defining a lower gas flow passage between the second heating surface and the lower face of the wafer, the second gas flow passage having an inlet opening which is positioned to receive gas when injected into the processing chamber through the inlet port;
a first heat lamp located to radiate through the upper window and heat the upper heat plate;
a second heat lamp located to radiate through the lower window and heat the lower heat plate; and
a temperature detector which detects a temperature within the semiconductor processing chamber.

19. The semiconductor processing system of claim 18 which includes structure which directs flow of gas from the inlet port to the inlet openings of the upper and lower gas flow passages.

* * * * *